United States Patent [19]

Lowe

[11] Patent Number: 5,146,197
[45] Date of Patent: Sep. 8, 1992

[54] SELF-SHIELDING HOMOGENEOUS SPHERICAL GRADIENT COILS

[75] Inventor: Irving J. Lowe, Pittsburgh, Pa.

[73] Assignee: University of Pittsburgh, Pittsburgh, Pa.

[21] Appl. No.: 469,970

[22] Filed: Jan. 25, 1990

[51] Int. Cl.$^5$ .......................... H01F 5/00; H01F 7/00; H01F 27/28

[52] U.S. Cl. .................................. 335/299; 335/301; 336/230

[58] Field of Search ................................ 335/210–214, 335/216, 296–301, 304; 315/5.35; 324/318–320; 336/127, 230

[56] References Cited

U.S. PATENT DOCUMENTS

| | | | |
|---|---|---|---|
| 2,265,041 | 12/1941 | Hipple | 335/299 |
| 3,052,859 | 9/1962 | Bers | 335/299 |
| 3,493,904 | 2/1970 | Favereau | 335/299 |
| 3,510,832 | 5/1970 | Golay | 335/299 |
| 3,515,979 | 6/1970 | Golay | 335/299 |
| 3,566,255 | 2/1971 | Jaynes | 335/299 |
| 3,582,779 | 6/1971 | Bloom | 335/299 |
| 3,622,869 | 11/1971 | Golay | 335/299 |
| 4,820,988 | 4/1989 | Crooks et al. | 324/318 |

OTHER PUBLICATIONS

Daniels et al., A Large Volume Homogeneous Low Field Electromagnet, 1971, pp. 576–581, CJP (49). CJP: Canadian Journal of Physics.

*Primary Examiner*—Gerald P. Tolin
*Assistant Examiner*—Raymond Barrera
*Attorney, Agent, or Firm*—Reed Smith Shaw & McClay

[57] ABSTRACT

A first set of three spherically or elliptically shaped coils is provided which generates a homogeneous linear gradient magnetic field in its interior. A second set of three spherically or elliptically shaped coils is located concentric to and in close proximity with the first coil set such that the fringing fields outside the second coil set are substantially zero. The coil sets can be separated at their equator and preferably are spherical in shape. The current distribution for each coil is described as well as the winding pattern on the surface of the first sphere which generates the perfectly homogeneous linear gradients inside the sphere. The second concentric sphere having a second coil set thereon which has a similar current distribution and winding pattern to the first coil set such that it will perfectly shield the inner sphere while reducing the linear gradient inside the first sphere by only a factor of $1-(R_1/R_2)^5$, where $R_1$ and $R_2$ are the radii of the inner and outer spheres, respectively.

17 Claims, 5 Drawing Sheets

SELF-SHIELDING HOMOGENEOUS SPHERICAL GRADIENT COILS

FIELD OF THE INVENTION

The present invention relates to a coil system used in nuclear magnetic resonance (NMR) and magnetic resonance imaging (MRI) for producing a gradient magnetic field and more particularly to a coil system having a linear gradient magnetic field inside the coil system and substantially no magnetic field outside the coil system.

BACKGROUND OF THE INVENTION

Many NMR procedures and tests such as MRI, volume selective excitation, diffusion, and fluid flow use gradient magnetic fields which must to be linear over large volumes and which have to be switched on and off rapidly. Typically, cylindrical shapes are used for the coils which generate these gradient magnetic fields. For example, a simple gradient coil set that generates x, y and z gradients can be wound on a cylinder of radius R and is made up of a Maxwell coil and two sets of saddle coils as is described in P. G. Morris, "Nuclear Magnetic Resonance Imaging in Medicine and Biology", Clarendon Press, Oxford, 1986. The volume within this cylinder over which the gradients are satisfactorily linear (i.e. the effective volume), however, is less than a sphere of radius 0.6 R due to the small number of wire positions used to construct the coils. This effective volume can be enlarged into a cylinder of radius R and having an arbitrary length by using a distributed filamentary winding on the surface of the cylinder which approximates a continuous current distribution.

Surrounding the gradient coil set are metallic structures such as dewars, magnet coil forms, or magnet windings in which the time dependent fringing field of the gradient coils generate eddy currents. The magnetic fields produced by the eddy currents distort the time dependence and spatial dependence of the gradient field within the gradient coil set. A second set of actively driven coils surrounds the original gradient set to shield the coils and thereby reduce the size of the fringing field. One such coil system for producing a linear gradient magnetic field in a cylinder is described in U.S. Pat. No. 4,737,716. Another cylindrical gradient system is shown in U.S. Pat. No. 4,646,024.

The techniques proposed in these references for producing linear gradients over large volumes and actively shielding them are based upon placing the gradient windings on long concentric cylinders. This is an attractive configuration because of the cylindrical symmetry of the superconducting magnets and the ease of inserting and removing of probes, samples, and specimens. However, the open ends of the cylindrical coils generate "end effects" on the gradient fields inside the cylinders, and thus create, non-uniformities in the gradient. There are also "end effects" that affect the shape of the fringing fields, thereby making it difficult to design the second set of coils required to shield the fringing field.

U.S. Pat. Nos. 3,566,255 and 3,582,779 disclose the use of a set of five or seven independent coil loops having different configurations which improve the homogeneity of certain magnetic fields by removing certain undesired first and second order gradients. The five coil set removes the first order gradients and the seven coil set removes the second order gradients. The figures in these patents show the different sets of coil configurations needed for a sphere and a cube. These coil configurations are described as being particularly useful where the gyromagnetic resonance of a sample is being measured for spectroscopy purposes or for measuring the magnitude of the magnetic field produced by the sample therein.

These patents do not show a coil system wherein the magnetic field outside the coil system is negligiable. Moreover, the coil system requires a set of five or even independent current loops wherein wires cross the equator of the sphere or cube.

It would be desirable, therefore, to develop a simple distributed coil system for generating a linear gradient magnetic field wherein these "end effects" and fringing fields did not present the problems described above.

SUMMARY OF THE INVENTION

Generally, the present invention greatly attenuates the "end effects" and fringing field problems discussed above by partially or completely closing the ends of the cylinders and putting coil windings on them. These "end effects" and fringing field problems can be completely eliminated by using coil windings having the shape of a sphere or an ellipsoid. Preferably, the coils are in the shape of a sphere and the calculation of the current distribution on the surface of the sphere which is required to generate a linear gradient magnetic field inside the sphere is explained in the Description of the Preferred Embodiment. As will be shown therein, none of the winding patterns which is used to generate each of the x, y and z gradients have wires crossing the equator of the sphere, thereby allowing the spheres to be split or separated at the equator to place other coils, samples and specimens inside, as shown in FIG. 1. Preferably, a separate coil for each of the x, y and z gradients is used, with the winding pattern for the x and y gradients being similar. By placing a second set of similarly patterned windings in the shape of a second sphere or ellipsoid such that they share the same focii with the first sphere or ellipsoid, the fringing field outside the second sphere or ellipsoid can be made zero everywhere.

The present invention enables simple current distribution patterns on a spherical or elliptical surface to generate a perfectly homogeneous linear gradient magnetic field inside the sphere or ellipsoid. The windings which generate the required current distribution pattern are placed on and distributed over the surface of the sphere or the ellipsoid. A separate winding or coil is used to generate the magnetic field in each of the x, y and z directions. Preferably the x and y coils are identical in shape and pattern except that the y coil is rotated 90° about the z axis from the x coil. The fringing magnetic field from the first sphere or ellipsoid can be perfectly shielded by a current distribution on the surface of a second concentric sphere or ellipsoid having a similar set of coils with a similar winding pattern. The second set of coils which provides the shielding, only has a small affect on the linear gradient field inside the first sphere or ellipsoid because of the fifth power in the reduction term which is $1-(R_1/R_2)^5$, where $R_1$, and $R_2$ are the radii of the inner and outer sphere or ellipsoid, respectively.

Prototype spherical gradient coils and shields having a distributed winding for each of the x, y and z gradients have been built and tested, and their magnetic field gradients have been found to be quite linear (within 1%)

over the total inner volume of the sphere. The spherical shield coils have been found to reduce the fringing field by more than a factor of 50 over all space outside the sphere in comparison to its unshielded value. These values are thought to be limited by the accuracy in placing the wires of the coils on the prototype sphere to obtain the current distribution necessary to produce the linear gradient magnetic fields. The placing of the wires was done manually for these prototypes and the winding patterns of FIG. 5 were used.

In the present invention, there are no coil windings that cross the equator of the sphere so that the sphere and the coils are easily separable at the equator without breaking any of the current paths. This enables samples, specimens and rf coils easily to be placed inside the coils. It should be further pointed out that in NMR and MRI applications, normally a large space is left between the gradient coils and the extended rf coil (such as a "bird cage") which is placed inside thereof, to decouple them and provide a return path for the rf flux. This space can easily be provided in the spherical gradient coil of the present invention. (See FIGS. 5 and 6). Additionally, due to the winding pattern of the z coils, small holes can be cut in these spheres or ellipsoids at the north and south poles to permit wires, leads or other items to penetrate the coil set without disturbing the magnetic field therein. This is due to the shape of the winding pattern of the z coil and can be seen more clearly in FIG. 5a.

The spherical gradient coil set and its shield coil set can be placed much closer together than in the cylindrical design without as much affect on or loss in the gradient field. As derived in the Appendix, the gradient field $G_a$ (wherein $a=x$, $y$, or $z$) for the cylindrical case is reduced by the factor $1-(R_1/R_2)^2$, where $R_1$ and $R_2$ are the radii of the gradient coil sets and their shield coil sets, respectively. This same factor for the spherical case is $G_a = 1-(R_1/R_2)^5$. The reason for the dramatic difference between the two geometries is that for long cylindrical gradient coils, the fringing field falls of as $1/\rho$, while for spherical gradient coil sets it falls off as $1/r^4$.

Other details, objects and advantages of the present invention will be more readily apparent from the following description of a presently preferred embodiment thereof.

BRIEF DESCRIPTION OF THE DRAWINGS

In the accompanying drawings, a preferred embodiment of the present invention is illustrated, by way of example only, wherein.

DESCRIPTION OF THE PREFERRED EMBODIMENT

While the present invention relates to coils in the shape of ellipsoids, the preferred embodiment is the ellipsoid wherein $R_1 = R_2 = r$, which results in a sphere. Accordingly, the following discussion will focus on coils which are spherical in shape although the discussion can be generalized to ellipsoids.

First, the current distributions on the surfaces of two concentric spheres of radii $R_1$ and $R_2$ ($R_1 < R_2$) will be calculated such that the magnetic field gradient $G_a$ ($a=x$, $y$, $z$) is uniformly linear inside the inner sphere, and the magnetic field B is zero everywhere outside the outer sphere. The current distribution on the inner sphere will be calculated to produce a uniform linear gradient inside the inner sphere and then the current distribution will be calculated for the outer sphere to make the combined magnetic fields outside the outer sphere zero while not distorting the combined gradient fields inside the inner sphere.

The starting point for the calculations are the two Maxwell equations for B and H for static magnetic fields:

$$\nabla \cdot B = 0 \qquad [1]$$

$$\nabla \times H = J \qquad [2]$$

In free space:

$$B = \mu_0 H, J = 0 \qquad [3]$$

($\mu_0 = 4\pi \times 10^{-7}$ webers/Amp meter).

Figure 1:
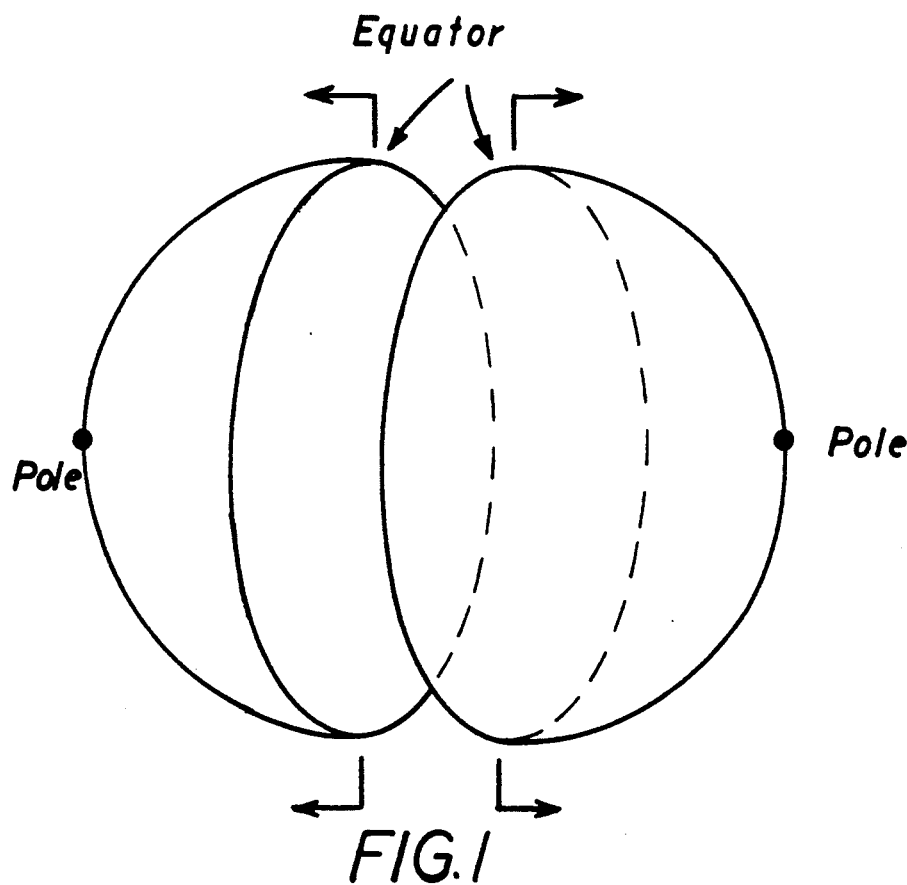
FIG. 1 shows a spherical form, separable at its equator and designed for receiving a set of coils for generating a linear gradient magnetic field where BO is along the coordinate z axis.
Figure 2:
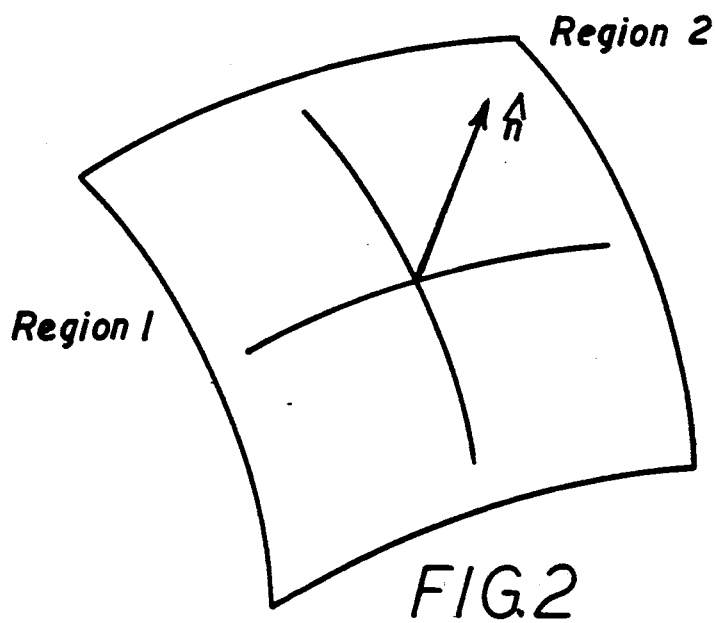
FIG. 2 shows the surface separating a region 1 and a region 2 wherein $\hat{n}$ is the normal to the surface and K is the current flowing along the surface.

At a surface between any two regions 1 and 2 separated by a surface (See FIG. 2) such a between inside and outside a sphere, B and H satisfy the boundary conditions that:

$$(B_2 - B_1) \cdot \hat{n} = 0 \qquad [4]$$

$$\hat{n} \times (H_2 - H_1) = K \qquad [5]$$

where n is the normal to the surface and K is the surface current density flowing in the surface.

Figure 3:
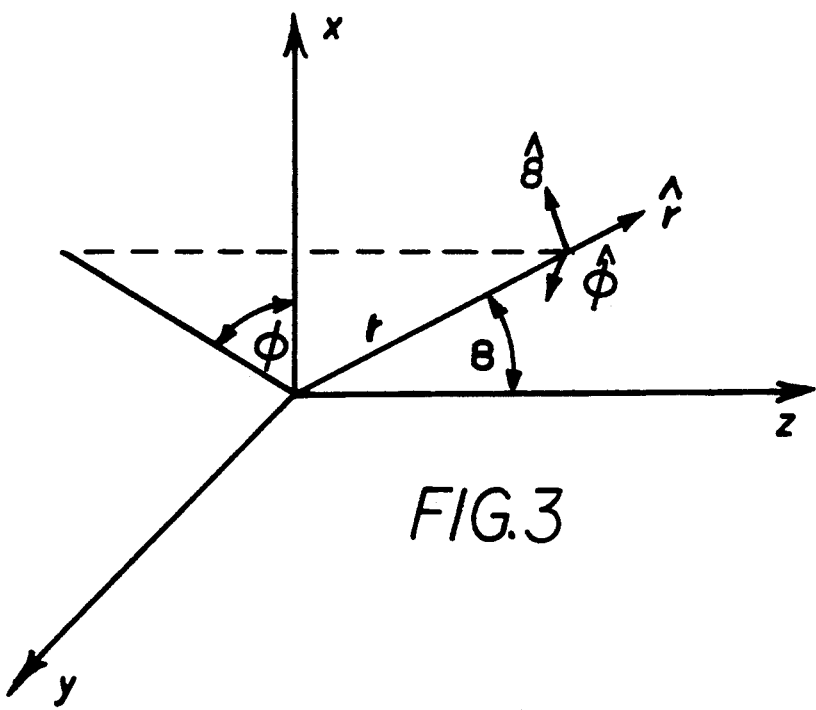
FIG. 3 shows a spherical coordinate system.

Expressed in spherical coordinated form (See FIG. 3), Equations [1] and [2] are:

$$\frac{1}{r^2} \frac{\partial}{\partial r}(r^2 B_r) + \frac{1}{r\sin\theta} \frac{\partial}{\partial \theta}(\sin\theta B_\theta) + \frac{1}{r\sin\theta}\left(\frac{\partial B_\phi}{\partial \phi}\right) = 0 \qquad [6]$$

$$\frac{1}{r\sin\theta}\left(\frac{\partial}{\partial \theta}(\sin\theta B_\phi) - \frac{\partial B_\theta}{\partial \phi}\right)\hat{r} = 0 \qquad [7]$$

$$\frac{1}{r}\left(\frac{1}{\sin\theta}\frac{\partial B_r}{\partial \phi} - \frac{\partial}{\partial r}(rB_\phi)\right)\hat{\theta} = 0 \qquad [8]$$

-continued $$\frac{1}{r}\left(\frac{\partial}{\partial r}(rB_\theta) - \frac{\partial B_r}{\partial \theta}\right)\hat{\phi} = 0 \qquad [9]$$

Figure 4:
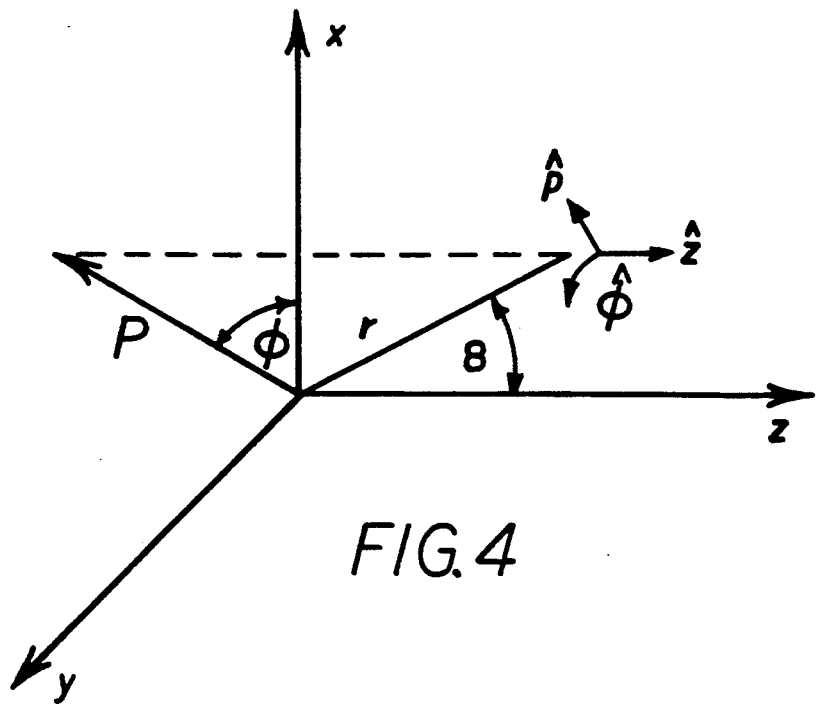
FIG. 4 shows a cylindrical coordinate system with $\rho = r\sin\theta$.

Expressed in cylindrical coordinate form (See FIG. 4), Equations [1] and [2] are:

$$\frac{1}{\rho}\frac{\partial}{\partial \rho}(\rho B_\rho) + \frac{1}{\rho}\frac{\partial B_\phi}{\partial \phi} + \frac{\partial B_z}{\partial z} = 0 \qquad [10]$$

$$\left(\frac{1}{\rho}\frac{\partial B_z}{\partial \theta} - \frac{\partial B_\phi}{\partial z}\right)\hat{\rho} = 0 \qquad [11]$$

$$\left(\frac{\partial B_\rho}{\partial z} - \frac{\partial B_z}{\partial \rho}\right)\hat{\phi} = 0 \qquad [12]$$

$$\frac{1}{\rho}\left(\frac{\partial(\rho B_\phi)}{\partial \rho} - \frac{\partial B_\rho}{\partial \phi}\right)\hat{z} = 0 \qquad [13]$$

A. Z Gradient Coil-Unshielded

Considering the inner sphere of radius R all by itself, to calculate the magnetic field and current distribution required to produce a homogeneous z gradient field inside the sphere, it is assumed that $$\hat{\phi} B_z = G_z z \qquad [14]$$

for $r<R$, where $G_z$ is the gradient produced by the current on the sphere. The gradient field has cylindrical symmetry for $r<R$ so that using cylindrical coordinates, $B_\rho$ and $B_\phi$ are independent of $\phi$. Using Equation [10] yields:

$$\frac{1}{\rho}\frac{\partial}{\partial \rho}(\rho B_\rho) + 0 + G_z = 0$$

Integrating from 0 to $\rho$ yields:

$$\rho B_\rho]_0^\rho = -\tfrac{1}{2}\rho^2 G_z + f(z,\phi)$$

Assuming $B_\rho$ is finite at $\rho=0$ so that $\rho B_{\rho 0}=0$ yields:

$$B_\rho = \frac{-1}{2} G_z \rho \qquad [15]$$

inside the spherical surface. Further, since $$B \cdot ds = \mu_0 I = 0$$

everywhere inside the spherical surface, by taking a circular contour around the z axis and using $B_\phi$'s independence of $\phi$ yields $B_\phi=0$ inside the sphere.

The magnetic field radial component $B_r$ is continuous across the surface of the inner sphere, while the difference of the tangential components yields the surface current density. Converting the above derived results in spherical coordinates yields for $r<R$:

$$B_r = \frac{G_z r}{2}(3\cos^2\theta - 1) \qquad [16]$$

$$B_\theta = \frac{-3}{4} G_z r \sin 2\theta \qquad [17]$$

-continued $$B_\phi = 0 \qquad [18]$$

Since $B_r$ is continuous across the surface of the sphere, outside the sphere at its surface:

$$B_r]_R = \frac{G_z R}{2}(3\cos^2\theta - 1) \qquad [19]$$

Equation [19] represents a pure quadrupolar distribution in $\theta$. It is assumed that for $r>R$:

$$B_r = \frac{G_z R}{2}(3\cos^2\theta - 1)\left(\frac{R}{r}\right)^4 \qquad [20]$$

The justification for this assumption will be that a set of values for $B_r$, $B_\theta$, and $B_\phi$ satisfying the boundary conditions and Maxwell's Equations for $r>R$ can be found for this choice of $B_r$. Substituting the above expression for $B_r$ into Equation [9] yields:

$$\frac{\partial}{\partial r}(rB_\theta) = \frac{\partial}{\partial \theta}\left(\frac{G_z R}{2}(3\cos^2\theta - 1)\left(\frac{R}{r}\right)^4\right) =$$

$$-3G_z R\cos\theta\sin\theta\left(\frac{R}{r}\right)^4$$

Integrating the above equation and assuming that $B_\theta$ vanishes at infinity as rapidly as $r^{-4}$ yields:

$$B_\theta = \frac{G_z R}{2}\sin 2\theta\left(\frac{R}{r}\right)^4 \qquad [21]$$

Similarly, substituting the expression for $B_r$ into Equation [8] yields:

$$\frac{\partial}{\partial r}(rB_\phi) = 0$$

Integrating the above equation and assuming that $B_\phi$ vanishes at infinity as $r^{-4}$ yields:

$$B_\phi = 0 \qquad [22]$$

As a check, these values for $B_r$, $B_\theta$ and $B_\phi$ satisfy Equations [6] and [7], the r component of the curl equation and the divergence equation.

The current K on the surface of the sphere that produces the magnetic field $B^i$ inside the sphere and $B_o$ outside the sphere can be found from Equation [5], which is rewritten below with slightly different symbols.

$$\mu_0 K = \hat{r} \times (B_0 - B_i) \qquad [23]$$

Using the values of $B_i$ and $B_o$ listed in Equations [16]-[18] and [20]-[22], the value of K is:

$$K = K_\phi \hat{\phi} \qquad [24]$$

$$K_\phi = \left(\frac{5}{4}\right)\left(\frac{G_z R}{\mu_0}\right)\sin 2\theta$$

$K_\phi$ is a current per unit perimeter line. The total current $I_{tz}$ crossing a line from the pole to the equator of the sphere is:

$$I_{tz} = \int_0^{\pi/2} K_\phi(\theta) R d\theta = \frac{5}{4} \frac{G_z R^2}{\mu_0} \quad [25]$$

If $I_{tz}$ is approximated by $N_z$ non-uniformly distributed turns of wire, each carrying current I, then with $I_{tz} = N_z I$ and $$G_z = \frac{4}{5} \frac{N_z I \mu_0}{R^2} \quad [26]$$

For comparison purposes, the gradient produced by a Maxwell pair of radius R and NI ampere turns per coil is:

$$G_z = \left(\frac{48}{49}\right)\left(\frac{3}{7}\right)^{\frac{1}{2}} \frac{\mu_0 NI}{R^2} \approx 0.6413 \frac{\mu_0 NI}{R^2} \quad [27]$$

Thus, the spherical z gradient coil and the Maxwell pair of the same dimensions have comparable efficiencies of z gradient per ampere turn of winding, except that the spherical gradient coil produces a more uniform gradient.

B. Z Gradient Coil-Shielded

To calculate the current distribution to shield the Z gradient coil, consider the case of two concentric spherical Z gradient coils with radii $R_1$ and $R_2$, with $R_1 < R_2$. The magnetic fields from the two coils everywhere add. From Equations [14] and [15] for $r < R_1$:

$$B_z = B_{1z} + B_{2z} = (G_{1z} + G_{2z})z \quad [28]$$

$$B_\rho = B_{1\rho} + B_{2\rho} = -\tfrac{1}{2}(G_{1z} + G_{2z})\rho \quad [29]$$

From Equations [20], [21] and [22], for $r > R_2$:

$$B_r = B_{1r} + B_{2r} = \left[\frac{(3\cos^2\theta - 1)}{2r^4}\right](G_{1z}R_1^5 + G_{2z}R_2^5) \quad [30]$$

$$B_\theta = B_{1\theta} + B_{2\theta} = \left[\frac{\sin 2\theta}{2r^4}\right](G_{1z}R_1^5 + G_{2z}R_2^5) \quad [31]$$

$$B_\phi = B_{1\phi} + B_{2\phi} = 0 \quad [32]$$

The magnetic field outside the second sphere vanish for the condition:

$$G_{2z} = -G_{1z}\left(\frac{R_1}{R_2}\right)^5 \quad [33]$$

Thus, the outer sphere with a similar current distribution can be made to shield the inner one. For the condition listed in Equation [33], for $r < R_1$:

$$B_z = G_{1z}\left(1 - \left(\frac{R_1}{R_2}\right)^5\right)z \quad [34]$$

$$B_\rho = \frac{1}{2} G_{1z}\left(1 - \left(\frac{R_1}{R_2}\right)^5\right)\rho \quad [35]$$

and the loss in gradient inside the sphere due to the shield can be quite small. For instance, the case where $R_1 = 0.75 R_2$ produces only a 24% loss in gradient strength due to shielding.

The current densities on spheres 1 and 2 from Equation [24] are:

$$K_{1\phi} = \frac{5}{4} \frac{G_{1z} R_1}{\mu_0} \sin 2\theta \quad [36]$$

$$K_{2\phi} = \frac{5}{4} \frac{G_{2z} R_2}{\mu_0} \sin 2\theta \quad [37]$$

Using the relation in Equation [33] yields:

$$\frac{K_2}{K_1} = -\left(\frac{R_1}{R_2}\right)^4 \quad [38]$$

If instead, one uses Equation [26] and Equation [33] with the condition that $I_1 = -I_2$, the turns ratio of the two coils on the two spheres is $$\frac{N_2}{N_1} = \left(\frac{R_1}{R_2}\right)^3 \quad [39]$$

C. X and Y Gradient Coils—Unshielded

The behavior of the magnetic field for the spherical x gradient coil and the current distribution needed to generate this field can be calculated using the same technique as for the z gradient coil. These x results can then be used to generate the magnetic field and current distribution for a y gradient coil by a 90° rotation of them about the z axis.

To calculate the current distribution on a sphere of radius R that produces a homogeneous x gradient field inside the sphere, it is assumed that:

$$B_z = G_x X \quad [40]$$

The simplest solution for $B_y$ and $B_x$ that satisfies $\nabla \times B = \nabla \cdot B = 0$ inside the sphere is:

$$B_x = G_x z \quad [41]$$

$$B_y 0 \quad [42]$$

Converting these in terms of spherical coordinates:

$$B_r = G_x r \sin 2\theta \cos \phi \quad [43]$$

$$B_\theta = G_x r \cos 2\theta \cos \phi \quad [44]$$

$$B_\phi = -G_x r \cos \theta \sin \phi \quad [45]$$

$B_r$ is continuous across the surface of the sphere and has the value:

$$B_r]_R = G_x R \sin 2\theta \cos \phi \quad [46]$$

For $r>R$, it is assumed that $B_r$ keeps the same angular dependence but decreases as $(R/r)^4$, the behavior of a quadruple. That is, for $r>R$:

$$B_r = G_x R \sin 2\theta \cos\phi \left(\frac{R}{r}\right)^4 \quad [47]$$

This assumption can be checked to see if $B_\theta$ and $B_\phi$ can be found for $r>R$ to see if they are consistent with Maxwell's equations. Substituting Equation [47] into Equation [8] gives:

$$\frac{\partial}{\partial r}(rB_\phi) = -2G_x R\cos\theta\sin\phi \left(\frac{R}{r}\right)^4 \quad [48]$$

Integrating with respect to r and setting the integration constant to 0 so that $B_\phi$ vanishes as $r^{-4}$ for large r, yields:

$$B_\phi = \frac{2}{3} G_x R \cos\theta\sin\phi \left(\frac{R}{r}\right)^4 \quad [49]$$

Substituting Equation [47] into Equation 9] yields $$\frac{\partial}{\partial r}(rB_\theta) = 2G_x R\cos 2\theta\cos\phi \left(\frac{R}{r}\right)^4$$

Again integrating with respect to r and setting the integration constant to 0 so that $B_\theta$ vanishes as $r^{-4}$ yields:

$$B_\theta = -\frac{2}{3} G_x R\cos 2\theta\cos\phi \left(\frac{R}{r}\right)^4 \quad [50]$$

These values of $B_r$, $B_\theta$ and $B_\phi$ are found to satisfy the other two Maxwell equations listed in Equations [6] and [7]. Since they satisfy the boundary conditions at the surface of the sphere, they are the correct magnetic fields for the homogeneous x gradient inside the sphere.

The current densities on the surface of the sphere can again be found using Equations [23], [49] and yielding:

$$K = \frac{1}{\mu_0} \hat{r} \times [(B_{0\theta} - B_{i\theta})\theta + (B_{0\phi} - B_{i\phi})\phi]_{r=R} = K_\phi \phi + K_\theta \theta$$

with:

$$K_\phi = -\left(\frac{5G_x R}{3\mu_0}\right)\cos 2\theta\cos\phi \quad [51]$$

$$K_\theta = -\left(\frac{5G_x R}{3\mu_0}\right)\cos\theta\sin\phi \quad [52]$$

The above values of $K_\theta$ and $K_\phi$ satisfy the current conservation law since $\nabla\cdot K=0$. Like the z gradient case, K is a current per unit perimeter line. The total current $I_{tx}$ crossing a line from $\theta=\pi/4$ to $\pi/4$ with $\phi=0$, is:

$$I_{tx} = \int_{-\pi/4}^{\pi/4} K_\phi(\phi=0)Rd\theta = -\frac{5G_x R^2}{3\mu_0} \quad [53]$$

If $I_{tx}$ is approximated by $N_x$ non-uniformly distributed turns of wire, each carrying current I so that $I_{tx}=N_x I$; then:

$$G_x = -\frac{3}{5}\mu_0 N_x I/R^2 \quad [54]$$

A comparison of Equations [54] and [26] shows generation of the $G_x$ gradient to be $\frac{3}{5}$ as efficient as $G_z$ in terms of ampere turns.

D. X and Y Gradient Coils—Shielded

The calculation of the shield for the x gradient coil will be carried out here, with an identical argument applying to the y gradient coil. Consider two concentric spherical gradient coils labeled 1 and 2 with radii $R_1$, and $R_2$, with $R_1<R_2$. The magnetic fields from the two coils everywhere add. From Equations [40] and [41], for $r<R_1$:

$$B_z = B_{1z}+B_{2z}=(G_{1x}+G_{2x})x \quad [55]$$

$$B_x = B_{1x}+B_{2x}=(G_{1x}+G_{2x})z \quad [56]$$

$$B_y = 0$$

From Equations [47], [49] and [50] for $r<R_2$:

$$B_r = (B_{1r} + B_{2r}) = (R_1^5 G_{1x} + R_2^5 G_{2x})\sin 2\theta\cos\phi/r^4 \quad [57]$$

$$B_\phi = (B_{1\phi} + B_{2\phi}) = \frac{-2}{3}(R_1^5 G_{1x} + R_2^5 G_{2x})\cos\theta\sin\phi/r^4 \quad [58]$$

$$B_\theta = (B_{1\theta} + B_{2\theta}) = \frac{-2}{3}(R_1^5 G_{1x} + R_2^5 G_{2x})\cos 2\theta\sin\phi/r^4 \quad [59]$$

Similarly to the z gradient case, the magnetic field outside the second sphere vanishes for the condition:

$$G_{2x} = -G_{1x}\left(\frac{R_1}{R_2}\right)^5$$

Thus the outer coil can be made to shield the inner x gradient coil. The resultant fields for $r<R_1$ are:

$$B_z = G_{1x}\left(1 - \left(\frac{R_1}{R_2}\right)^5\right)x \quad [60]$$

$$B_x = G_{1x}\left(1 - \left(\frac{R_1}{R_2}\right)^5\right)z \quad [61]$$

and again the loss in gradient strength inside the sphere due to the shield can be quite small.

E. Winding Patterns for Coils

The following description mathematically shows the translation of the surface current densities into winding patterns for the coil sets on the surface of a sphere. The winding patterns are shown in FIGS. 5a–5d.

1. Z Gradient Coil

For the z gradient coil, the surface current density on the surface of a sphere that generates a homogeneous gradient inside the sphere is listed in Equation [24], and the relation between $G_z$ and the total ampere turns on a hemisphere is listed in Equation [26].

The $K_\phi(\theta)$ will be approximated by a set of N current loops whose planes are parallel to the x-y plane (the equator); each loop carrying current I.

The nth loop approximates the current between $\theta_n$ (the leading edge of the current section) and $\theta_{n-1}$ (the trailing edge of the current section). $\delta_n$ is the angular width of the $n^{th}$ section with $$\delta_n = \theta_n - \theta_{n-1} \qquad [62]$$

For the $n^{th}$ section, using Equation [24]

$$I = \int_{\theta_{n-1}}^{\theta_n} K_\phi(\theta) R d\theta = \frac{5}{4} \frac{G_z R^2}{\mu_0} \int_{\theta_{n-1}}^{\theta_n} \sin 2\theta \, d\theta \qquad [63]$$

$$I = \frac{5}{8} \frac{G_z R^2}{\mu_0} (\cos 2\theta_{n-1} - \cos 2\theta_n)$$

Thus, $$\cos 2\theta_{n-1} - \cos 2\theta_n = \alpha \qquad [64]$$

$$\alpha = \frac{8 I \mu_0}{5 G_z R^2} \qquad [65]$$

Assuming that there are exactly $N_z$ sections with $\theta_0 = 0$ (trailing edge of first section) and $\theta_{N_z} = \pi/2$ (leading edge of last section), Equation [60] generates the sequence:

$$\begin{aligned}\cos 2\theta_1 &= 1 - \alpha \\ \cos 2\theta_2 &= \cos \theta_1 - \alpha = 1 - 2\alpha \\ \cos 2\theta_n &= 1 - n\alpha \\ \cos 2\theta_{N_z} &= 1 - N_z \alpha \\ \alpha &= \frac{2}{N_z}\end{aligned} \qquad [66]$$
$$[67]$$

Equations [67] and [26] are identical to one another. Replacing by $2/N_z$ in Equation [66] yields the angular locations of the $N_z$ sections:

$$\cos 2\theta_n = 1 - \left(\frac{2n}{N_z}\right) \qquad [68]$$

The maximum current density occurs at $\theta = 45°$. For odd $N_z$, $\theta = 45°$ is the center of the $\frac{1}{2}(N+1)$ section. This section has the minimum width, denoted by $\delta_{min}$. Thus, $$\theta\left(\frac{N_z + 1}{2}\right) - \theta\left(\frac{N_z - 1}{2}\right) = \delta_{min}$$

$$\theta\left(\frac{N_z + 1}{2}\right) + \theta\left(\frac{N_z - 1}{2}\right) = \pi/4$$

and $$\theta\left(\frac{N_z + 1}{2}\right) = \frac{\pi}{4} + \frac{\delta_{min}}{2} \qquad [69]$$

Using Equation [68] yields:

$$\cos\left(2\left(\frac{\pi}{4} + \frac{\delta_{min}}{2}\right)\right) = 1 - \frac{2}{N_z}\left(\frac{N_z + 1}{2}\right) \qquad [70]$$

Soloving yields:

$$\sin \delta_{min} = 1/N_2 \qquad [71]$$

The various relationships listed above are sufficient to design a single layer, spherical, z gradient coils set. A typical winding pattern for this coil set is pictured in FIGS. 5a and 5b.

2. X and Y Gradient Coils

For the x gradient coil, the surface current density on the surface of a sphere that generates a homogeneous gradient is given by Equations [51] and [52], and the relationship between the gradient $G_x$ and the total ampere turns is given by Equation [54].

The path of the wire carrying current I that approximates $K_\theta$ and $K_\phi$ at point $(\theta, \phi)$ on the sphere is not as easily described as in the z gradient case. Let a section of wire of length and direction dl pass through point $(\theta, \phi)$. In terms of $\theta$ and $\phi$:

$$dl = Rd\theta\hat{\theta} + R\sin\theta d\phi\hat{\phi} \qquad [72]$$

$$Idl = IRd\theta\hat{\theta} + IR\sin\theta d\phi\hat{\phi} \qquad [73]$$

For I dl to approximate K at position $(\theta, \phi)$, its two components should have the same ratio as $K_\theta$ to $K_\phi$. Thus, $$\frac{IRd\theta}{IR\sin\theta d\phi} = \frac{K_\theta}{K_\phi} = \frac{\cos\theta\sin\phi}{\cos 2\theta \cos\phi} \qquad [74]$$

Simplifying and integrating:

$$2\frac{\cos 2\theta}{\sin 2\theta} = \frac{\sin\phi}{\cos\phi} d\phi \qquad [75]$$

$$\ln(\sin 2\theta) = -\ln(\cos\phi) + \text{constant}$$

$$\sin 2\theta \cos\phi = c$$

where c can vary between $+1$ and $-1$, each value of c leading to a different contour. Since there are $N_x$ turns on each hemisphere, there should be $N_x$ different values of c's, labeled $c_1, c_2, c_{Nx}$. Setting $\phi = 0$ $$c_n = \sin 2\theta_n \qquad [76]$$

The current densities at $\phi = 0$ are:

$$K_\theta = 0 \qquad [77]$$

$$K_\phi = \frac{5}{3} \frac{G_x R}{\mu_0} \cos 2\theta$$

Defining $\theta' = \theta - 45°$ leads to $$K_\phi = \frac{5}{3} \frac{G_x R}{\mu_0} \sin 2\theta' \qquad [78]$$

and the problem of approximating the current densities at $\phi = 0$ for various $\theta$'s is the same as for the z gradient since Equation [78] has the same form as Equation [24]. Thus, for the $n^{th}$ wire:

$$\cos 2\theta_n' = 1 - \frac{2n}{N_x} = \sin 2\theta_n \qquad [79]$$

and $$C_n = 1 - 2n/N_x$$

$$n = 0, 1, 2, \ldots N_x - 1.$$

Figure 5A:
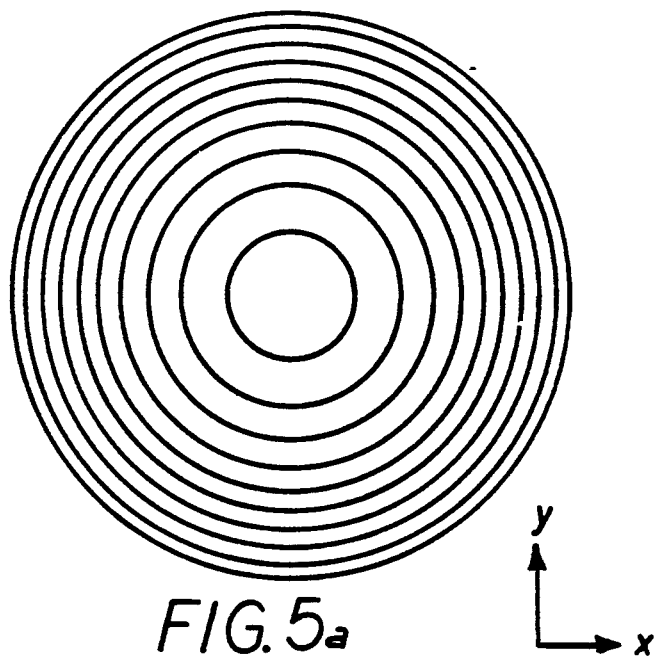
FIGS. 5a and 5b show a linear gradient coil wire winding pattern of the z gradient coil on a sphere having 10 turns per hemisphere, with 5a being viewed along the z-axis and 5b being viewed along the x-axis.
Figure 5B:
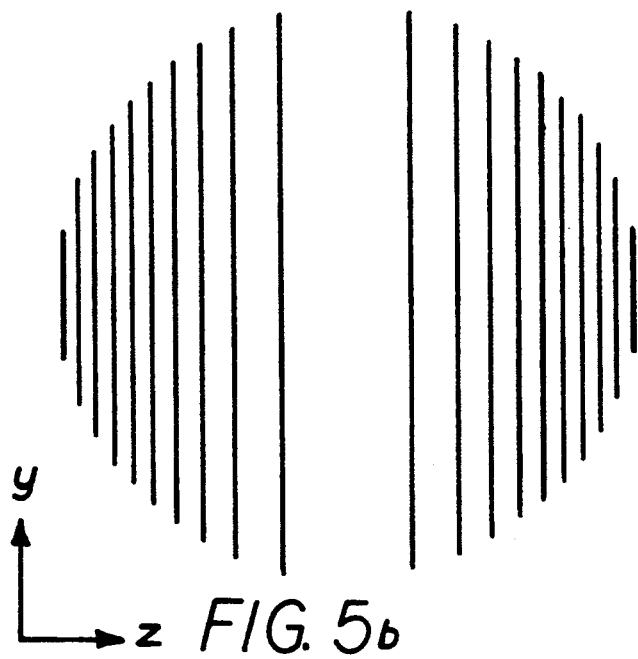
Figure 5C:
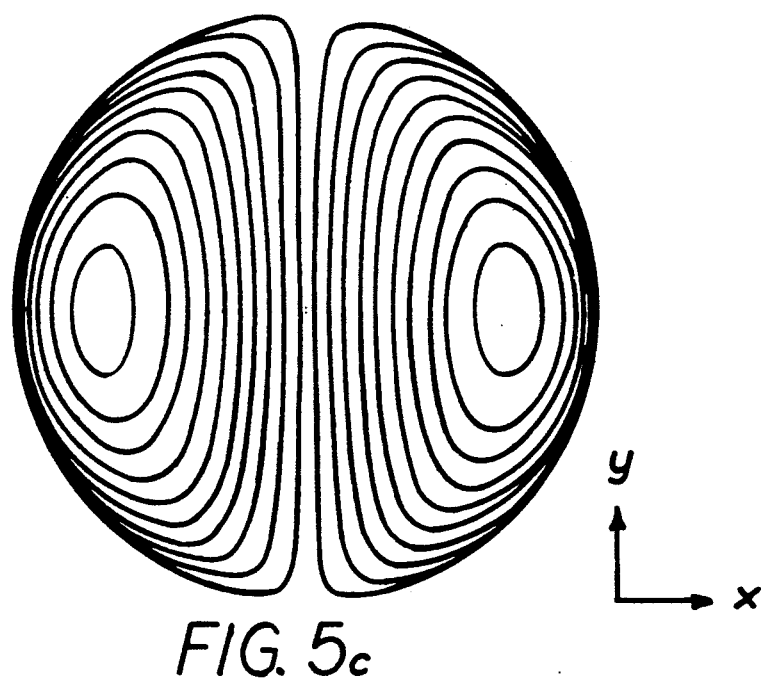
FIGS. 5c and 5d show a gradient coil wire winding pattern of the x gradient coil on a sphere having 20 turns per hemisphere, with 5c being viewed along the z-axis and 5d being viewed along the y-axis.
Figure 5D:
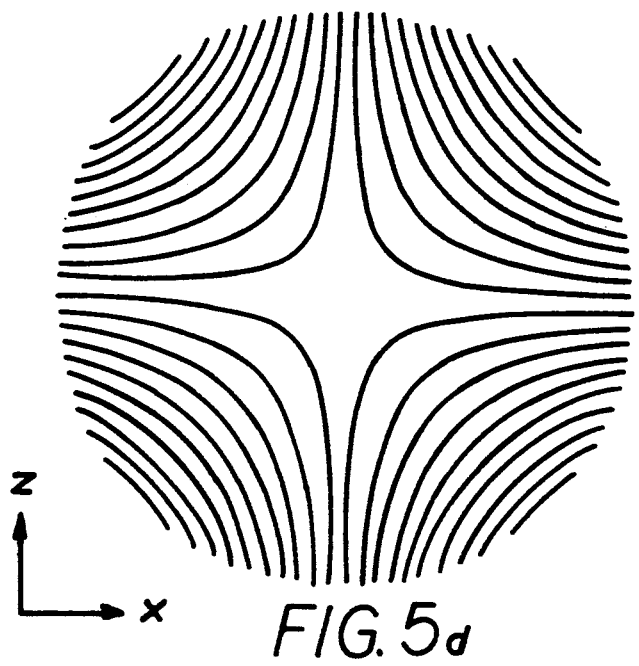

A typical winding pattern for an x or y gradient coil is pictured in FIG. 5c and 5d.

Figure 6:
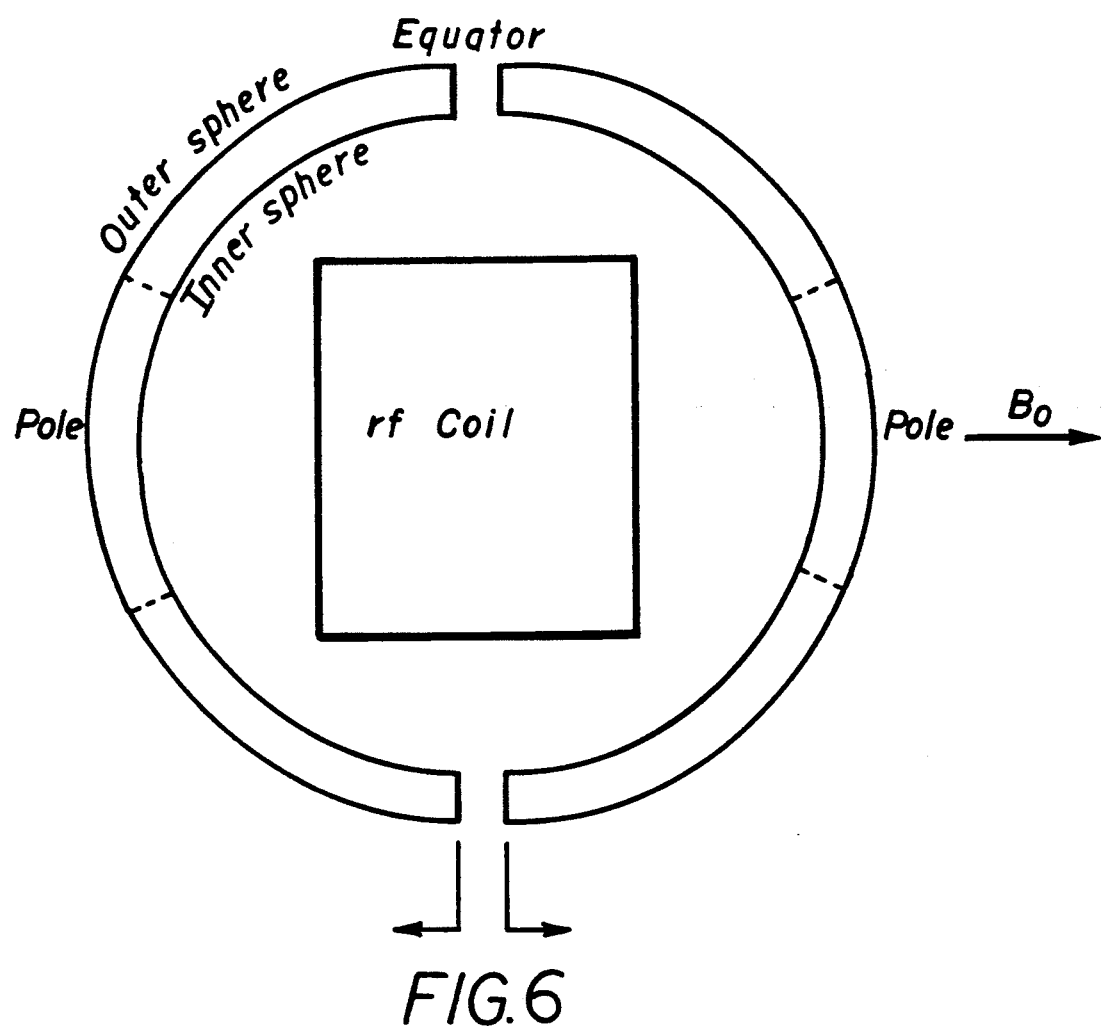
FIG. 6 shows the placing of an extended rf coil inside a shielded gradient coil set of the present invention.

Shown in FIG. 6 are dotted lines indicating where holes can be cut into the spheres at the north and south poles. These small holes (on the order of 2 cm. in diameter in a 20 cm. diameter sphere), can be used for rf leads to the coil or for monitoring lines to the sample or specimen undertest. The small holes at the poles have been found (both theoretically and experimentally) to not appreciably degrade the homogeneity and shielding performance of the gradient coils. The holes are small and located far from the bore tube of the magnet and the central region of the sphere. Moreover, by using extra compensating turns, the holes can be considerably enlarged without degrading the shielding or homogeneity performance very much.

While a presently preferred embodiment of practicing the invention has been shown and described with particularity in connection with the accompanying drawings, the invention may otherwise be embodied within the scope of the following claims.

APPENDIX

A set of self shielding coils that produce homogenerous gradients along the x, y and z axes can be designed from a pair of infinitely long concentric cylinders of radii $R_1$ and $R_2$. The calculational technique used is the same as that described above in the Description of the Preferred Embodiment for the spherical gradient coils, and therefore, only the results will be provided herein. The axes of the two cylinders (labeled 1 and 2) will be assumed to be along the z axis. Cylindrical coordinates will be used to describe the results, and $R_1 < R_2$.

A. For a single infinitely long cylinder of radius $R_1$, the results are:

z Gradient

For $\rho < R_1$ $$B = G_{1z}\left(z - \frac{1}{2}\rho\rho\right)$$

For $\rho > R_1$ $$B = \left(-\frac{1}{2} G_{1z} R_1^2/\rho\right)\rho$$

$$K_1 = \frac{G_{1z}}{\mu_0} z\theta$$

X and Y Gradient (Only the results for the x gradient are given since the y gradient results can be generated from those for x gradient by a rotation of 90° about the z axis).

For $\rho < R_1$
$$B = G_{1x}(xz + zx)$$

-continued

For $\rho > R_1$ $$B = G_{1x}\left(\frac{R_1^2}{\rho^2}\right)(z\cos\theta\rho + z\sin\theta\theta - \rho\cos\theta z)$$

$$K = \frac{2G_{1x}}{\mu_0}(R_1\cos\theta\theta + z\sin\theta z)$$

The parametric equation that describes the wire path that approximates $K_1$ is: $z\cos\theta = c_n$ where $n = 0, 1, 2, 3, \ldots$ and each $c_n$ describes a different wire path.

B. For a shielded pair of infinitely long cylinders of radius $R_1$ and $R_2$, the results are:

Z Gradient

For $\rho < R_1$ $$B = G_{1z}\left(1 - \left(\frac{R_1}{R_2}\right)^2\right)\left(z - \frac{1}{2}\rho\rho\right)$$

For $\rho > R_2$
$$B = 0$$

$$K_1 = \frac{G_{1z}}{\mu_0} z\theta$$

$$K_2 = -\left(\frac{R_1}{R_2}\right)^2 K_1$$

X and Y Gradient (Again only the x gradient is given for the reason stated above).

For $\rho < R_1$ $$B = G_{1x}\left(1 - \left(\frac{R_1}{R_2}\right)^2\right)(xz + zx)$$

For $\rho > R_2$
$$B = 0$$

$$K_1 = \frac{2G_{1x}}{\mu_0}(R_1\cos\theta\theta + z\sin\theta z)$$

$$K_2 = -\left(\frac{R_1}{R_2}\right)^2 K_1$$

What is claimed is:

1. A device for generating magnetic fields comprising: a first set of elliptically shaped coils for generating a linear gradient magnetic field inside thereof, the first set of coils comprising a plurality of coils, each coil generating a magnetic field in a different direction; a second set of elliptically shaped coils in close proximity thereto and surrounding the first set of coils such that any fringing field outside the second set of coils is substantially zero, the second set of coils comprising a plurality of coils, each coil generating a magnetic field in a direction corresponding to one of the directions of the magnetic field generated by the first set of coils; and wherein the first and second sets of coils can be separated at an equator.

2. The device as described in claim 1 wherein the first set of coils comprises 3 coils, each coil generating a magnetic field in either the x, y or z direction such that a magnetic field is generated in each of those directions.

3. The device as described in claim 2 wherein the second set of coils comprises 3 coils, each coil generating a magnetic field in either the x, y or z direction such that a magnetic field is generated in each of those directions.

4. The device as described in claim 3 wherein the coils of the first set which generate the magnetic field in the x and y directions have a similar winding pattern but are shifted about the z axis from one another by 90°.

5. The device as described in claim 4 wherein the coils of the second set which generate the magnetic field in the x and y directions have a similar winding pattern but are shifted about the z axis from one another by 90°.

6. The device as described in claim 5 wherein the coil of the first set generating the magnetic field in the z direction has a winding pattern of concentric loops.

7. The device as described in claim 6 wherein the coil of the second set generating the magnetic field in the z direction has a winding pattern of concentric loops.

8. The device as described in claim 7 wherein the winding pattern of the coils in the first and second sets generating the magnetic field in the z direction has a sin $2\theta$ distribution according to the following equation:

$$K_\phi = \left(\frac{5}{4}\right)\left(\frac{G_zR}{\mu_0}\right)\sin 2\theta,$$

where $K_\phi$ is a current per unit perimeter line; $G_z$ is the magnetic gradient field in the z direction; R is the radius of the sphere; and $\mu_0$ is a constant equal to $4\pi \times 10^{-7}$ webers/Amp Meter.

9. The device as described in claim 7 wherein the winding pattern of the coils in the first and second sets generating the magnetic fields in the x and y direction are similar in shape and have a distribution according to the following equations:

$$K_\phi = -\left(\frac{5G_xR}{3\mu_0}\right)\cos 2\theta\cos\phi; \text{ and} \quad \text{(i)}$$

$$K_\phi = -\left(\frac{5G_xR}{3\mu_0}\right)\cos\theta\sin\phi \quad \text{(ii)}$$

where $G_x$ is the magnetic gradient field in the x direction; R is the radius of the sphere; $\mu_0$ is a constant equal to $4\pi \times 10^{-7}$ webers/Amp meter; and $K_\phi$ and $K_\theta$ are current per unit perimeter lines.

10. The device as described in claim 7 wherein small holes can be made at the poles of the first and second sets of coils to permit leads to enter therethrough into the interior of the sphere.

11. The device as described in claim 1 wherein the first and second sets of coils are spherical.

12. The device as described in claim 3 wherein the first and second sets of coils are spherical.

13. The device as described in claim 5 wherein the first and second sets of coils are spherical.

14. The device as described in claim 7 wherein the first and second sets of coils are spherical.

15. The device as described in claim 8 wherein the first and second sets of coils are spherical.

16. The device as described in claim 9 wherein the first and second sets of coils are spherical.

17. The device as described in claim 10 wherein the first and second sets of coils are spherical.

* * * * *

UNITED STATES PATENT AND TRADEMARK OFFICE
CERTIFICATE OF CORRECTION

PATENT NO. : 5,146,197
DATED : September 8, 1992
INVENTOR(S) : Irving J. Lowe

It is certified that error appears in the above-identified patent and that said Letters Patent is rrected as shown below:

Column 1, line 4, insert the following:

The present invention was developed in part with government support under Grant Number 1 RO3 RR03817 awarded by the National Institutes of Health.

Signed and Sealed this

Fifth Day of October, 1993

Attest:

BRUCE LEHMAN

Attesting Officer     Commissioner of Patents and Trademarks